United States Patent [19]
Lattimore et al.

[11] Patent Number: 6,002,626
[45] Date of Patent: *Dec. 14, 1999

[54] METHOD AND APPARATUS FOR MEMORY CELL ARRAY BOOST AMPLIFIER

[75] Inventors: George McNeil Lattimore, Austin; Robert Anthony Ross, Jr., Cedar Park; Gus Wai-Yen Yeung, Austin, all of Tex.

[73] Assignee: International Business Machines Corporation, Armonk, N.Y.

[*] Notice: This patent is subject to a terminal disclaimer.

[21] Appl. No.: 08/904,987

[22] Filed: Aug. 1, 1997

[51] Int. Cl.$^6$ .................................................... G11C 7/02
[52] U.S. Cl. ........................ 365/208; 365/205; 365/207
[58] Field of Search ..................................... 365/208, 205, 365/207; 327/57, 51

[56] References Cited

U.S. PATENT DOCUMENTS

| | | | |
|---|---|---|---|
| 4,558,241 | 12/1985 | Suzuki et al. | 307/530 |
| 4,845,675 | 7/1989 | Krenik et al. | 365/203 |
| 5,017,815 | 5/1991 | Shah et al. | 307/530 |
| 5,245,223 | 9/1993 | Lim et al. | 307/362 |
| 5,294,847 | 3/1994 | Grossman et al. | 307/530 |
| 5,526,314 | 6/1996 | Kumar | 365/207 |
| 5,663,905 | 9/1997 | Matsuo et al. | 365/149 |

OTHER PUBLICATIONS

1996 Symposium on VLSI Circuits; Digest of Technical Papers: "A 500 MHz 1Mb On–Chip Cache Design Using Multi–Level Bit Line Sensing Scheme", Richard Guo, Terry Y. Su, Chia–Chi Chao; pp. 130, 131.

*Primary Examiner*—Huan Hoang
*Assistant Examiner*—Hoai V. Ho
*Attorney, Agent, or Firm*—Anthony V. S. England

[57] ABSTRACT

A method and apparatus is provided for implementing a memory cell array having a performance-improved critical read path using a Domino boost amplifier configuration. The memory bit line is broken into small segments with a Domino boost amplifier and the bit line is connected to the input of the amplifier. The output of the amplifier drives the global bit line. The amplifier is turned "on" during a "read" and turned "off" during a "write". During a read, one memory cell within one array segment is turned on. The memory cell drives the differential signal on to the local bit line pair. Also during a read, the boost amplifier which attaches to that local bit line is enabled. The boost amplifier amplifies the input signal (local bit line pair) and drives that signal on to the global bit line. Since the bit line is broken into small segments with boost amplifiers, there are many boost amplifiers attached on the global bit line. When enough signal is developed on the global bit line pair, the other boost amplifiers which are attached to the global bit line will be turned on. The bit line is thus quickly pulled to ground thereby significantly improving performance for the critical read path.

25 Claims, 4 Drawing Sheets

METHOD AND APPARATUS FOR MEMORY CELL ARRAY BOOST AMPLIFIER

RELATED APPLICATIONS

The present application is related to a co-pending application entitled "BIT LINE BOOST AMPLIFIER", Ser. No. 09/082,540, filed on May 21, 1998, and Ser. No. 09/078,248, filed on May 13, 1998 assigned to the assignee of the present application.

FIELD OF THE INVENTION

The present invention relates generally to digital logic signal processing and more particularly to a boost amplifier circuit for use in memory circuits.

BACKGROUND OF THE INVENTION

In general, the term "domino logic" is used to refer to an arrangement of logic circuit stages which may, for example, be cascaded together in an integrated circuit array configuration. A signal may be inputted to a first stage where it is evaluated in order to provide an output signal to a second stage where that output signal is again evaluated to provide an output signal for propagation to and evaluation by yet another stage in the circuit. Thus a "domino" effect is achieved whereby signals are sequentially propagated through an array of "stages" or "domino blocks", and each successive stage performs an evaluation of an input condition until a final output is provided at a final output stage. Domino logic circuits may be arranged so that signals can propagate through the various stages without being separately clocked at each stage.

In traditional differential signal memory arrays utilizing the standard six device cell, four transistors are configured to form a cross-coupled latch/memory cell for storing data and two transistors are used to obtain access to the memory cell. During a "read" access, differential data stored within the memory cell is transferred to an attached bit line pair. Differential voltage is allowed to develop on the bit lines until sufficient offset between bit lines (100–200 mv) has developed to reliably sense the binary state of the memory cell. with the completion of the read, the differential bit line pairs are clamped together and restored high (to a "high" logic level voltage or "VDD") to cancel the offset generated during the read operation.

During a "write" access, data is written into the cell through the differential bit line pair. In general, one side of the bit line pair is driven low (i.e. to a low logic level potential or ground) and the other side of the differential pair is driven high to VDD minus the threshold voltage of the transistor Vt. Following the write, the differential bit line pair must be restored to VDD prior to the next read/write access to the memory cell. For a traditional memory array, the time required for a sufficient bit line offset development to reliably read the memory cell in addition to the time required to restore one-half of the differential bit line pair ground potential to VDD after a write operation defines the minimum cycle time for the array.

Improvements to either the bit line offset development rate, or the bit line restore time following a write, will increase performance of the memory structure as a whole. For a large array, it is more efficient if the array is organized in long column bit lines, i.e. many rows. However, the length of an array bit line is limited by the signal development time for a read. For an array with a long bit line, the signal development time is therefore the most critical path.

Thus there is a need to provide an improved method and apparatus for the implementation of a boost amplifier circuit which is effective to boost the performance of a critical read path in memory cell arrays having extensive bit line layouts.

SUMMARY OF THE INVENTION

A method and apparatus is provided for implementing a memory cell array having a performance-improved critical read path using a Domino boost amplifier configuration. The memory bit line is broken into small segments with a Domino boost amplifier and the bit line is connected to the input of the amplifier. The output of the amplifier drives the global bit line. The amplifier is turned "on" during a "read" and turned "off" during a "write". During a read, one memory cell within one array segment is turned on. The memory cell drives the differential signal on to the local bit line pair. Also during a read, the boost amplifier which attaches to that local bit line is enabled. The boost amplifier amplifies the input signal (local bit line pair) and drives that signal on to the global bit line. Since the bit line is broken into small segments with boost amplifiers, there are many boost amplifiers attached on the global bit line, and when enough signal is developed on the global bit line pair, the other boost amplifiers which are attached to the global bit line will be turned on. The bit line is thus quickly pulled to ground thereby significantly improving performance for the critical read path.

BRIEF DESCRIPTION OF THE DRAWINGS

A better understanding of the present invention can be obtained when the following detailed description of a preferred embodiment is considered in conjunction with the following drawings, in which.

DETAILED DESCRIPTION

Although the present disclosure shows isolated Domino circuitry for the sake of simplicity, it is understood that the present invention is not limited to isolated logic implementations or logic array implementations but rather also includes systems in which the methodology taught herein is implemented within or as part of a single system CPU or other larger semiconductor system, chip, processor or integrated circuit. Also, in the present example, the terms "source" or "source potential" or "VDD" are used interchangeably to refer to a logic "1" or "high" level potential. Also the terms "zero level", "ground potential", or "ground" are also used interchangeably to refer to a logic "0" or "low" level potential.

Figure 1:
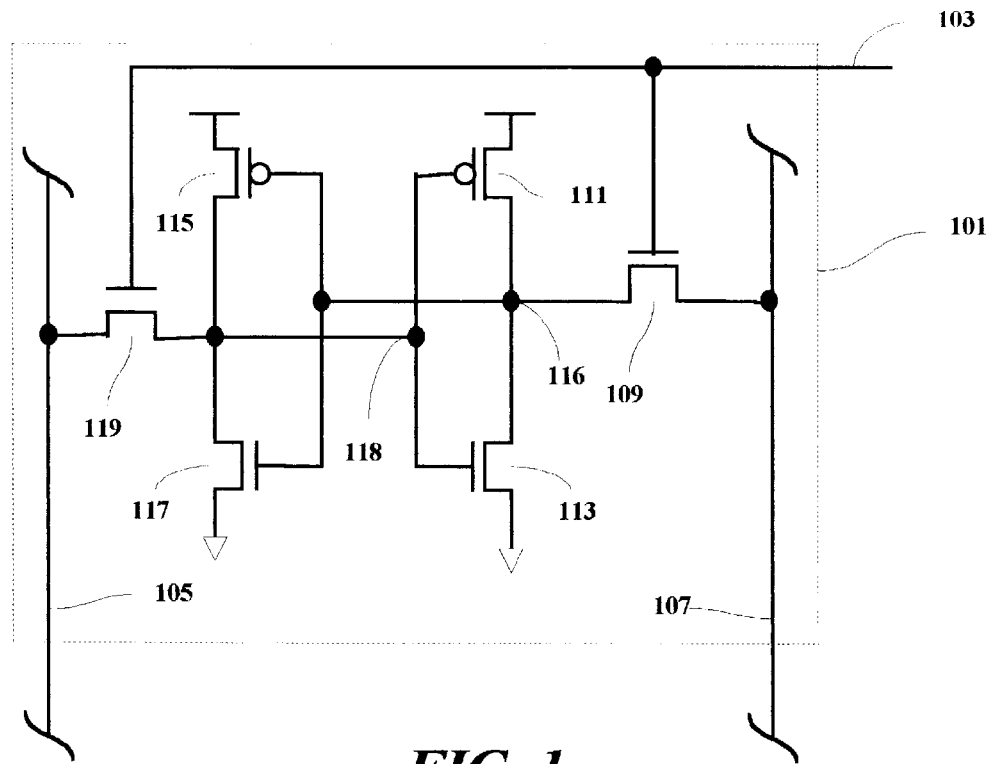
FIG. 1 is a circuit diagram of a typical six transistor single port memory cell.

With reference to FIG. 1, there is shown a typical prior art six transistor memory cell 101 including a read/write line 103 and output bit lines 105 and 107. Line 103 is connected to a gate terminal of an n-channel transistor 109. Transistor 109 is connected between output bit line 107 and a common point 116 between the output terminals of a p-channel transistor 111 and an n-channel transistor 113. Transistors 111 and 113 are connected between a high logic level and a ground potential in the present example. The common point 116 is also connected to the gate terminals of a p-channel transistor 115 and an n-channel transistor 117. Transistors 115 and 117 are connected between a high logic level and a ground potential in the present example. A second common point 118 between the output terminals of transistors 115 and 117 is connected to the gate terminals of transistors 111 and 113. The common point 118 is also connected through an n-channel transistor 119 to the bit line 105. Transistor 119 has its gate terminal connected to the line 103. As hereinbefore described, transistors 111, 113, 115 and 117 are used to form a cross-coupled latch memory cell for storing data and transistors 109 and 119 are used to obtain access to the memory cell. During a read access, for example, differential data stored within this memory cell is transferred to the attached bit line pair 105 and 107 in a conventional and well known manner.

Figure 2:
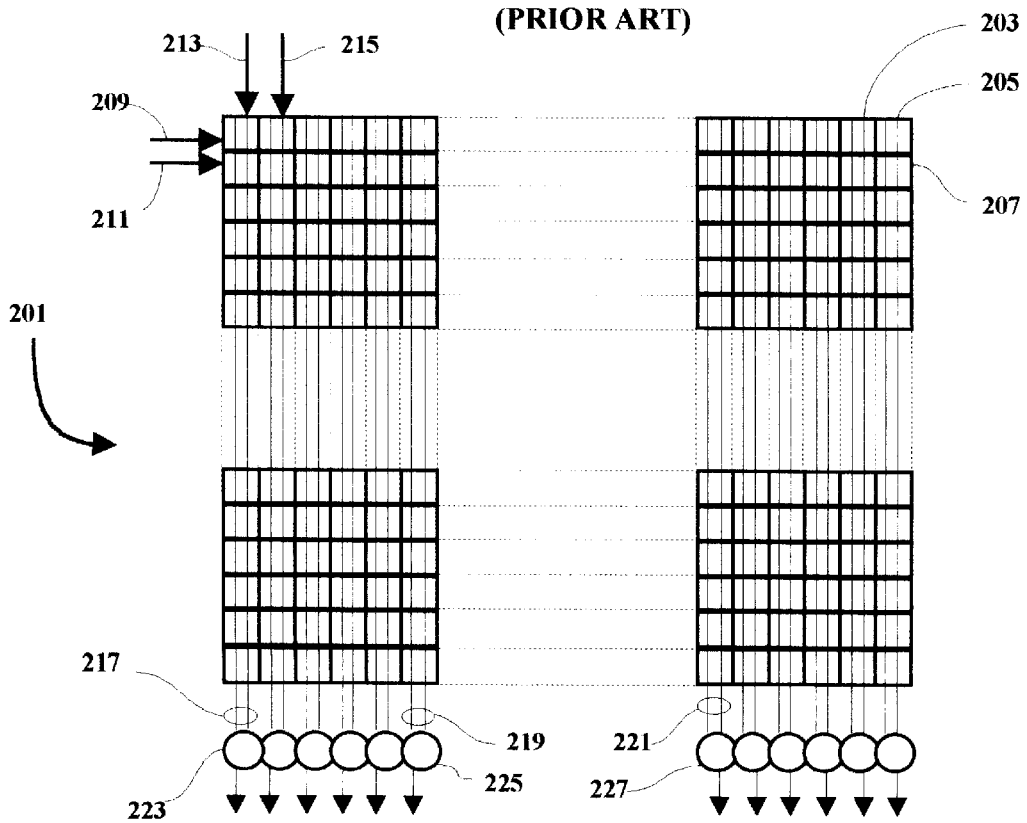
FIG. 2 is a schematic diagram of a typical large array memory cell configuration.

FIG. 2 illustrates a typical prior art memory cell configuration 201 comprised of individual cells such as cells 203, 205 and 207, connected together in rows (such as rows 209 and 211) and columns (such as columns 213 and 215). As illustrated, bit line pairs, such as bit line pairs 217, 219 and 221, are connected through long column bit lines to corresponding sense amplifiers such as amplifiers 223, 225 and 227. The performance of the prior art configuration illustrated in FIG. 2 is limited by the signal development time for the relatively long column bit lines.

Figure 3:
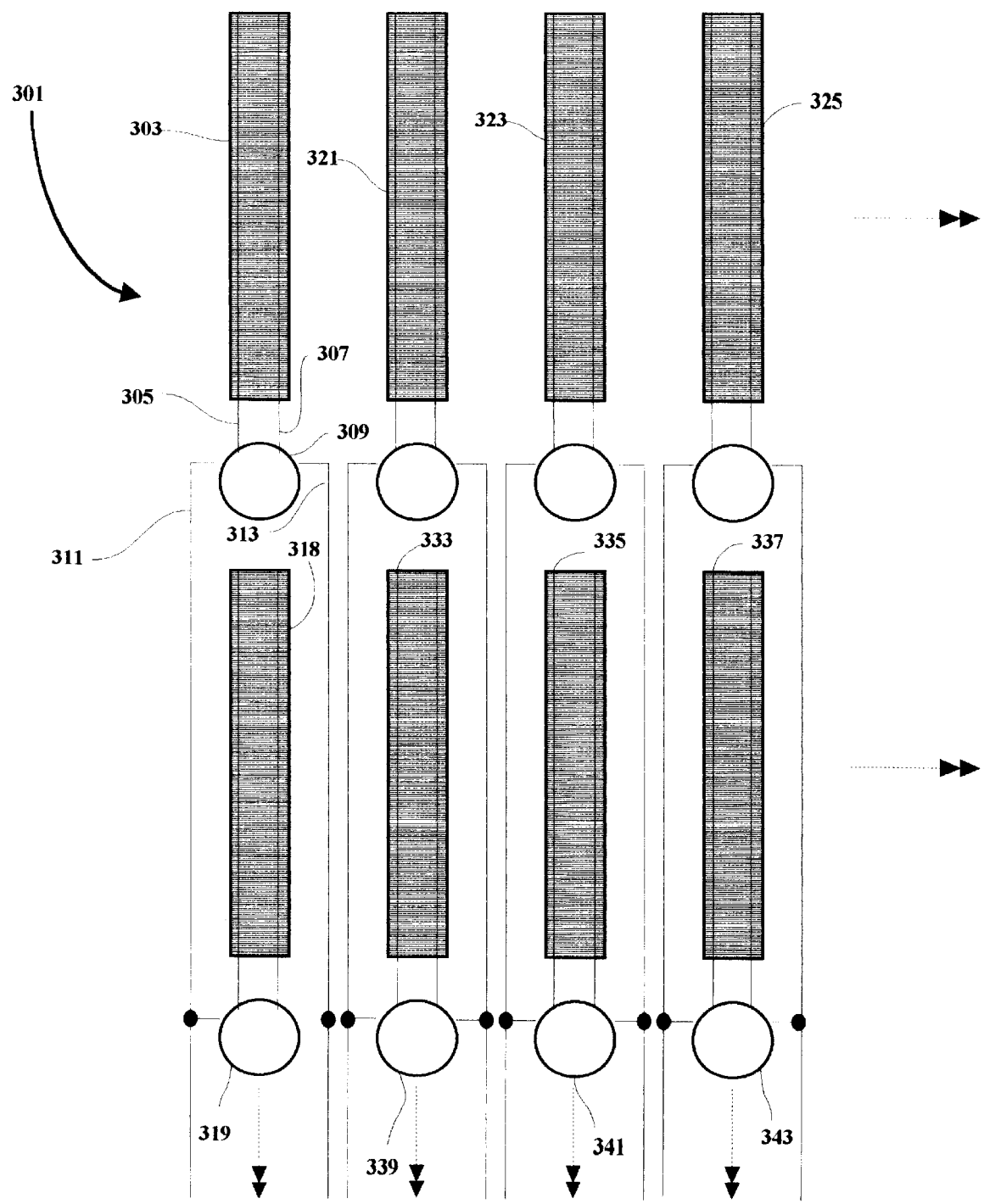
FIG. 3 is a schematic diagram of a large array memory cell configuration including an exemplary embodiment of a boost amplifier implementation in accordance with the present invention.

FIG. 3 illustrates a memory cell array configuration 301 having a Domino boost amplifier implementation in accordance with the present invention. in the example, columns or groups of memory cells, such as columns 303, 321 323 and 325, are arranged in an array configuration. Each group of memory cells has a pair of "local" bit lines such as bit lines 305 and 307 connected to each cell and through the column or group to a corresponding booster amplifier such as amplifier 309. A second row of memory cell groups or columns such as columns 318, 333, 335 and 337 is shown with each group connected to a corresponding booster amplifier such as amplifiers 319, 339, 341 and 343, respectively. All of the booster amplifiers are also connected to corresponding pairs of "global" bit line pairs such as bit lines 311 and 313.

The rows and columns are arranged in an array configuration and are extended as illustrated in order to implement various circuit memory requirements.

Figure 4:
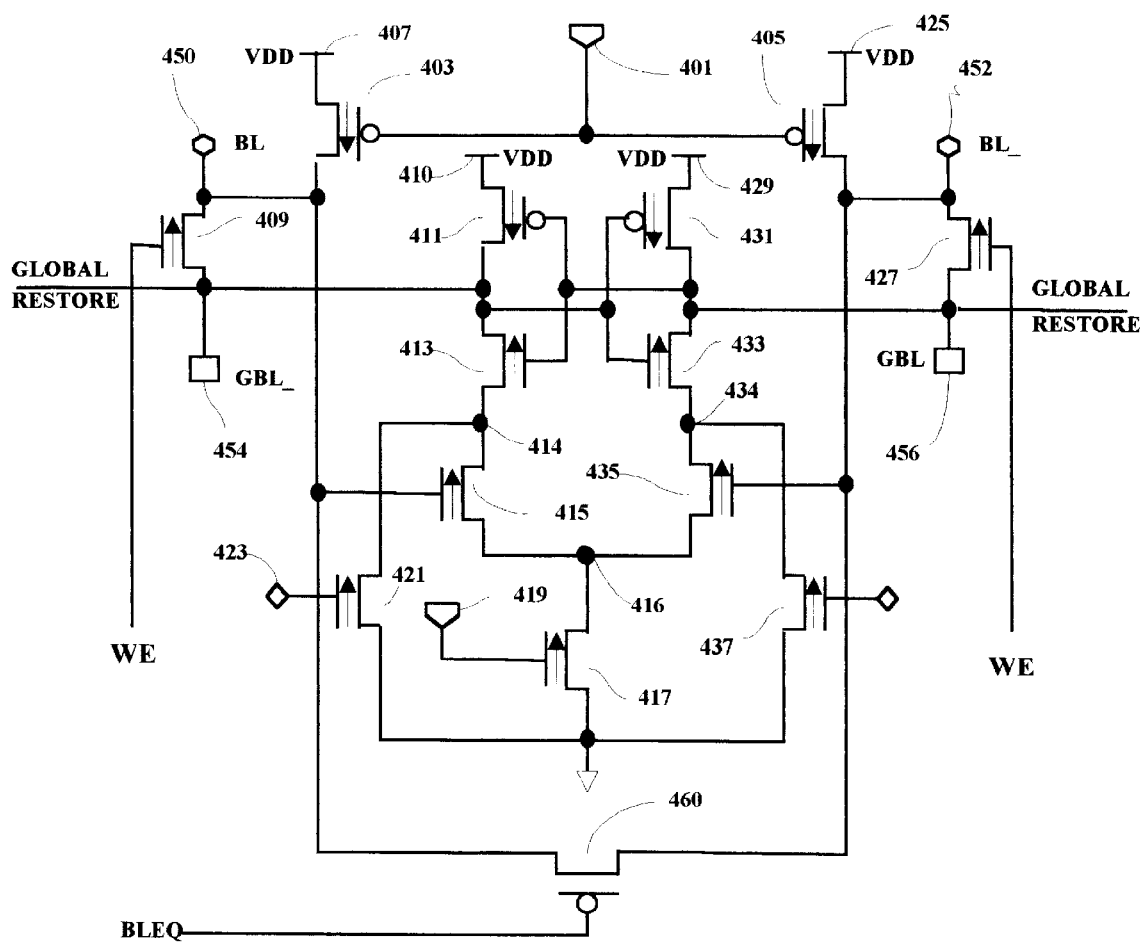
FIG. 4 is a circuit diagram of an exemplary embodiment of a Domino boost amplifier memory cell configuration in accordance with the present invention.

In FIG. 4, an exemplary circuit diagram for a memory cell with a "Domino" boost amplifier is illustrated. A control node 401 is connected to a common point which connects the gate terminals of p-channel transistors 403 and 405. Transistor 403 is connected between VDD, or a high logic level 407, and a gate terminal of an n-channel transistor 415. P-channel transistor 411 is serially connected with an n-channel transistor 413 between VDD 410 and a common point 414. Transistor 415 connects common point 414 to common point 416 which, in turn is connected through an n-channel transistor 417 to ground. The gate terminal of transistor 417 is connected to a control node 419. An n-channel transistor 421 also connects the common point 414 to ground, and the gate terminal of transistor 421 is connected to a "common" connection 423. An n-channel transistor 409 connects the drain terminal of transistor 403 with a common point between transistors 411 and 413. The gate terminal of transistor 409 is connected to a write enable "WE" input line. P-channel transistor 431 and n-channel transistor 433 are serially connected between VDD 429 and a common point 434. Point 434 is connected through an n-channel transistor 435 to common point 416 and also through another n-channel transistor 437 to ground. The gate terminal of transistor 437 is connected to a global sense amplifier control point 423. The gate terminals of transistors 411 and 413 are connected together and to a common point between transistors 431 and 433. Similarly, in a cross-coupled configuration, the gate terminals of transistors 431 and 433 are connected together and to a common point between transistors 411 and 413. P-channel transistor 405 is connected between VDD 425 and the gate terminal of transistor 435. The gate terminal of transistor 435 is also connected through an n-channel transistor 427 to the common point between transistors 431 and 433. The gate terminal of transistor 427 is connected to a write enable "WE" input. The drain terminals of transistors 409 and 427 are connected to points of connection 450 and 452, respectively, to accommodate a connection to "local bit line pair" connections "BL" and "BL_" of a larger array circuit. Similarly, the source terminals of transistors 409 and 427 are connected to points of connection 454 and 456, respectively, to accommodate a connection to "global bit line pair" connections "$GBL_{13}$" and "GBL" of a larger array circuit. A PMOS transistor or equalizer device 460 is arranged to be activated by a bit line equalizer signal BLEQ to selectively connect the local bit lines BL and BL_ together to equalize the local bit lines during idle states when neither a read operation not a write operation is active. "Global Restore" lines are connected to the global bit lines 454 and 456 in order to enable a global restore function to the global bit lines in a manner similar to the restore function to the local bit lines accomplished by the restore transistors 403 and 405.

Functionally, transistors 403 and 405 operate as a pull-up device and transistors 411, 431, 413 and 433 operate as a latch device. Transistors 409 and 427 operate as write enable devices. Transistors 415 and 435 operate as a first stage or a local stage sensing device to sense the voltage differential between the bit lines 450 and 452 while transistors 421 and 437 operate as second stage sense enable devices or global sense enable devices to sense the voltage differential between the global bit lines 454 and 456. Transistor 417 operates as a local sensing enable device in the present example enabling the first stage or local bit line amplifier. It is understood that the example illustrated shows only one of many possible implementations of the functional circuit inter-relationships created to provide the boost amplifier benefits herein described, and that the present invention is not limited to the specific embodiment shown as an example but rather is intended to include implementations using any technology to duplicate the stated relationships or equivalents thereof. In operation, the gate terminals of PMOS transistors 403 and 405 are connected to "control_" and are used to restore the local bit line 450 and 452, respectively, to VDD when a local bit line is not accessed. NMOS 409 and 427 gates are turned "on" if "write" is enabled, i.e. if WE is at a logic "1" or a high level. The Domino boost amplifier portion of the circuit includes PMOS transistors 411 and 431, and NMOS transistors 415, 435, 413, 433, 421, 437, and 417. PMOS transistors 411 and 431 and NMOS transistors 413 and 433 are commonly referred to as a cross-coupled latch. The gates of NMOS transistors 415 and 435 are connected to the local bit line pair 450 and 452, respectively, and the drains of NMOS transistors 413 and 433 are connected to the global bit line pair 454 and 456, respectively. The gate of NMOS transistor 417 is connected to "control"

419 (the inversion of "control_" 401) and is used as an enable device. Transistor 417 is turned "on" during a read access. When transistor 417 is turned on, the boost amplifier is activated and amplifies input signal to output. NMOS transistors 421 and 437 gates are connected to a global sense amplifier control point 423. They are turned on (following some delay for sufficient signal development) after a read access. NMOS transistors 421, 437, 413 and 433, and PMOS transistors 411 and 431 are similar to a voltage sense amplifier.

When the array 301 is in the idle state, the Domino boost amplifier is turned "off". Since the "bit line" is broken into a local bit line pair 450, 452 and global bit line pair 454, 456, separate restore devices for the two different bit line groups are required. PMOS transistors 403 and 405 are used to restore and keep the local bit line at VDD when the array is in the idle state. The signal "control_" 401, global sense amplifier control point 423 and "control" 419 are at ground level when the array is not being accessed. During a "write", "control" 419 and global sense amplifier control point 423 are at ground level and "control$_{13}$" 401 is at VDD level. NMOS transistors 409 and 427 are turned on by WE. They are used as transfer devices to transfer data from the global bit line onto the local bit line. The boost amplifier is turned off during a write access.

For a read access, there are two different implementations. In one implementation, during a read, PMOS devices 403 and 405 are turned off, as well as NMOS devices 409 and 427. NMOS 417 is immediately turned on. Since both the global and local bit line group are restored to VDD, the gates of NMOS 415, 435, 413 and 433 are all at VDD and turned on. When NMOS 417 is turned on, a conduction path from the drains of NMOS 413 and 433 to ground are established. At that time both NMOS path 413 and 433 are conducting and discharging their drain nodes. The drain nodes are connected to the gates of PMOS 411 and 431 and as they are being discharged, the PMOS devices are slowly turned on. As the read access progresses, one of the bit lines is discharging to ground (the bit line pair is a "True/Complement" pair) and the other bit line is driving VDD-Vt (the transfer device within a memory cell is NMOS which cannot drive a VDD output). The gates of transistors 415 and 435 are connected to the local bit lines 450 and 452, one of the NMOS devices is becoming less and less conductive (since one of the bit lines is discharging to ground) and the drain of this NMOS is driven closer to VDD by the PMOS connected to it. At the same time, because of the cross-coupled nature of the circuit, the other half of the circuit is becoming more and more conductive and driving the output closer to ground.

When one side of the NMOS path is becoming less conductive, the output of the other side (which is driven closer to ground) is making the NMOS (either 413 or 433) from the less conductive path, even less conductive. That feed-back loop is amplified and one of the global bit lines is pulled closer to ground while the other global bit line is pushed closer to VDD. After some differential signal has been developed on the global bit line pair 454, 456, NMOS devices 421 and 437 for all the Domino boost amplifiers attached on the global bit line pair are turned on. PMOS devices 411 and 431 and NMOS devices 413, 433, 421 and 437 are commonly referred to as a sense amplifier. A Domino boost amplifier integrates both a boost amplifier and a sense amplifier to improve area and read access time. When NMOS devices 421 and 437 are turned on, all of the Domino boost amplifiers on the global bit line pair are turned on and amplify the differential on the global bit line pair. That process will quickly pull one global bit line to ground and the other global bit line to VDD. With a Domino boost amplifier, the global bit line pair is pulled to rail and therefore the traditional sense amplifier is not required.

In a different implementation, the basic sequence remains the same, but NMOS devices 421 and 437 from different segments are enabled in a "domino" fashion. For example, if a memory cell from the top of the array is being accessed, NMOS 417 in the Domino boost amplifier within the accessed group is first turned on, after some delay, NMOS devices 421 and 437 in the amplifier within the same group are turned on after additional delay, NMOS devices 421 and 437 in the amplifier residing below the current group are turned on, and after more delay NMOS devices 421 and 437 from the next group of memory cells are turned on, and so forth. This adds more complexity in circuit design and requires more dummy/timing paths to control different groups. However, with this "domino" control method, differential signal is being amplified as it is being developed. With a long bit line, there are significant RC delays on the line and it takes time to drive a signal from the top to the bottom of an array. With a "domino" control timing path, just as the signal has developed enough offset, it is amplified. With that implementation, it is not required to wait for the complete differential signal at the bottom of the array before all of the Domino boost amplifiers are turned on, and the read forward time is decreased. Also, with many sense amplifiers instead of one, process variations and mis-match conditions are reduced, and drive capability is increased to support longer arrays.

Figure 5:
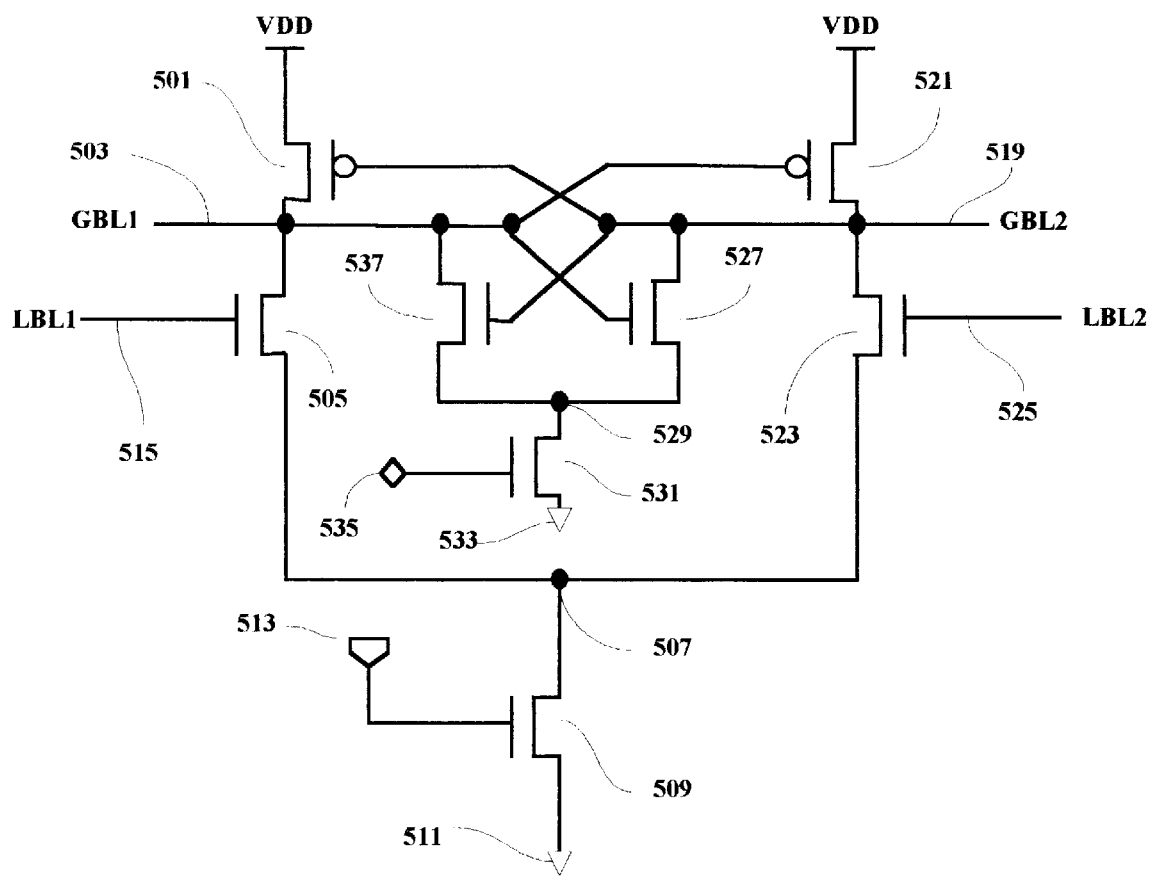
FIG. 5 is an alternate embodiment of a Domino boost amplifier memory cell configuration.

In FIG. 5, an alternate arrangement for the Domino bit line boost amplifier is illustrated. PMOS transistor 501 connects VDD to a global bit line GBL1 503. GBL1 503 is connected through series connected NMOS transistors 505 and 509 to ground 511. The gate terminal of transistor 505 is connected to local bit line LBL1 515. The gate terminal of transistor 509 is connected to a control node 513. Another PMOS transistor 521 connects VDD to a second global bit line GBL2 519, which is, in turn connected through NMOS transistor 523 to a common point 507 connected between transistors 505 and 509. The gate terminal of transistor 523 is connected to local bit line LBL2 525. GBL2 519 is also connected to the gate terminal of a transistor 537 and through series connected NMOS transistors 527 and 531 to ground 533. The gate terminal of transistor 533 is connected to a control point 535. A common point 529 between transistors 527 and 531 is connected through NMOS transistor 537 to the first global bit line GBL1 503. Global bit line GBL1 503 is connected to the gate terminal of transistor 527 and also to the gate terminal of pull-up transistor 521. Similarly, global bit line GBL2 519 is connected to the gate terminal of pull-up transistor 501. Functionally, transistors 505 and 523 are first stage or local bit line sensing devices while transistors 527 and 537 are second stage or global bit line sensing devices. Transistors 501 and 521 function as pull-up transistors. Transistor 531 functions as a second stage enable device and transistor 509 functions as a first stage enable device.

The operation of the arrangement illustrated in FIG. 5 is similar to that described in connection with FIG. 4 except that there is no internal cross-coupled feed back corresponding to transistors 413 and 433 of FIG. 4. The alternate embodiment illustrated in FIG. 5 is less sensitive to noise, the NMOS stack is reduced to two, and may be a better choice for some memory cell arrays.

The method and apparatus of the present invention has been described in connection with a preferred embodiment as disclosed herein. Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A boost amplifier circuit comprising:
   a first enabling device, said first enabling device being selectively operable in response to a first enable signal;
   a first stage amplifier connected to said first enabling device, said first stage amplifier being arranged for connection to a local bit line pair of signal lines for receiving an input signal from said local bit line pair of signal lines, said first stage amplifier being selectively enabled by said first enabling device for amplifying said input signal and providing a first stage output signal;
   a second stage amplifier connected to said first stage amplifier, said second stage amplifier being arranged for connection to a global bit line pair of signal lines, said second stage amplifier being selectively operable for amplifying said first stage output signal and providing a second stage output signal for application to said global bit line pair of signal lines; and
   a latch circuit connected to said first stage amplifier and said second stage amplifier, said latch circuit being arranged for connection to said global bit line pair of signal lines, said latch circuit being selectively operable for storing said second stage output signal, said first stage amplifier being serially connected between said first enabling device and said latch circuit.

2. The boost amplifier circuit as set forth in claim 1, wherein said second stage amplifier is arranged to be selectively operable following a predetermined time delay following an occurrence of said first enable signal.

3. The boost amplifier circuit as set forth in claim 2 wherein said first enable signal is a read enable signal, said read enable signal being selectively generated to initiate a read cycle to read said second stage output signal.

4. The boost amplifier circuit as set forth in claim 3 and further including:
   a second enable device connected to said boost amplifier circuit, said second enable device being arranged for receiving a write enable signal, said second enable device being operable in response to a received write enable signal for enabling a writing operation of said boost amplifier.

5. The boost amplifier circuit as set forth in claim 4 wherein said first enable device is disabled during said writing operation.

6. The boost amplifier circuit as set forth in claim 5 and further including:
   a local bit line equalizer device connected between first and second local bit lines of said local bit line pair, said local bit line equalizer device being selectively operable for equalizing potential levels between said first and second local bit lines.

7. The boost amplifier as set forth in claim 6 wherein said local bit line equalizer device is operable to equalize potential levels between said first and second local bit lines during idle states of the boost amplifier circuit.

8. The boost amplifier as set forth in claim 7 and further including means arranged to be selectively connected to said global bit line pair for selectively restoring said global bit line pair to a predetermined default potential level.

9. The boost amplifier as set forth in claim 8 and further including:
   first and second pull-up devices connecting said first and second local bit lines to a predetermined default potential during idle states of said boost amplifier.

10. The boost amplifier as set forth in claim 1 wherein said latch comprises a cross-coupled latch memory cell.

11. The boost amplifier as set forth in claim 10 wherein said latch further comprises first, second, third and fourth cross-coupled MOS transistor devices.

12. The boost amplifier circuit as set forth in claim 1 wherein said boost amplifier circuit is included within one integrated circuit.

13. A circuit configuration comprising:
   a first group of memory cells arranged in a first array in a first alignment;
   first and second local bit lines of said first group, said first and second local bit lines of said first group being connected to each memory cell of said first group, said first and second local bit lines of said first group being arranged to provide a first group output signal;
   a global bit line pair of signal lines including first and second global bit lines;
   a first boost amplifier arranged to receive said first group output signal and provide a first group global signal for application to said global bit line pair;
   a second group of memory cells arranged in a second array in line with said first alignment;
   first and second local bit lines of said second group, said first and second local bit lines of said second group being connected to each memory cell of said second group, said first and second local bit lines of said second group being arranged to provide a second group output signal; and
   a second boost amplifier arranged to receive said second group output signal and provide a second group global signal for application to said global bit line pair.

14. The circuit configuration as set forth in claim 13 wherein said first boost amplifier comprises:
   a first enabling device, said first enabling device being selectively operable in response to a first enable signal;
   a first stage amplifier connected to said first enabling device, said first stage amplifier being arranged for connection to a local bit line pair of signal lines for receiving an input signal from said local bit line pair of signal lines, said first stage amplifier being selectively enabled by said first enabling device for amplifying said input signal and providing a first stage output signal;
   a second stage amplifier connected to said first stage amplifier, said second stage amplifier being arranged for connection to a global bit line pair of signal lines, said second stage amplifier being selectively operable for amplifying said first stage output signal and providing a second stage output signal for application to said global bit line pair of signal lines; and
   a latch circuit connected to said first stage amplifier and said second stage amplifier, said latch circuit being arranged for connection to said global bit line pair of signal lines, said latch circuit being selectively operable for storing said second stage output signal, said first stage amplifier being serially connected between said first enabling device and said latch circuit.

15. The circuit configuration as set forth in claim 14, wherein said second stage amplifier is arranged to be selectively operable following a predetermined time delay following an occurrence of said first enable signal.

16. The circuit configuration as set forth in claim 15 wherein said first enable signal is a read enable signal, said read enable signal being selectively generated to initiate a read cycle to read said second stage output signal.

17. The circuit configuration as set forth in claim 16 and further including:

a second enable device connected to said boost amplifier circuit, said second enable device being arranged for receiving a write enable signal, said second enable device being operable in response to a received write enable signal for enabling a writing operation of said boost amplifier.

18. The circuit configuration as set forth in claim 17 wherein said first enable device is disabled during said writing operation.

19. The circuit configuration as set forth in claim 18 and further including:

a local bit line equalizer device connected between first and second local bit lines of said local bit line pair, said local bit line equalizer device being selectively operable for equalizing potential levels between said first and second local bit lines.

20. The circuit configuration as set forth in claim 19 wherein said local bit line equalizer device is operable to equalize potential levels between said first and second local bit lines during idle states of the boost amplifier circuit.

21. The circuit configuration as set forth in claim 20 and further including means arranged to be selectively connected to said global bit line pair for selectively restoring said global bit line pair to a predetermined default potential level.

22. The circuit configuration as set forth in claim 21 and further including:

first and second pull-up devices connecting said first and second local bit lines to a predetermined default potential during idle states of said boost amplifier.

23. The circuit configuration as set forth in claim 14 wherein said latch comprises a cross-coupled latch memory cell.

24. The circuit configuration as set forth in claim 23 wherein said latch further comprises first, second, third and fourth cross-coupled MOS transistor devices.

25. The circuit configuration as set forth in claim 13 wherein said circuit configuration is included within one integrated circuit.

* * * * *